United States Patent
Trout et al.

[11] Patent Number: 6,083,026
[45] Date of Patent: Jul. 4, 2000

[54] RETENTION MEMBER FOR PROCESSOR MODULE

[75] Inventors: David A. Trout, Wrightsville; Earl W. McCleerey, Mechanicsburg; Kevin E. Walker, Hershey, all of Pa.

[73] Assignee: The Whitaker Corporation, Wilmington, Del.

[21] Appl. No.: 09/289,265

[22] Filed: Apr. 9, 1999

Related U.S. Application Data

[60] Provisional application No. 60/084,085, May 4, 1998.

[51] Int. Cl.[7] .................................................. H01R 13/62
[52] U.S. Cl. ............................................ 439/328; 439/377
[58] Field of Search ................................... 439/328, 325, 439/357, 358, 377, 64, 218, 327

[56] References Cited

U.S. PATENT DOCUMENTS

| | | | |
|---|---|---|---|
| 3,829,741 | 8/1974 | Athey | 361/756 |
| 4,241,966 | 12/1980 | Gomez | 439/157 |
| 4,349,237 | 9/1982 | Cobough et al. | 439/377 |
| 4,501,458 | 2/1985 | Cubbage | 339/17 |
| 4,873,479 | 10/1989 | Iimura et al. | 320/2 |
| 4,941,839 | 7/1990 | Negasaka et al. | 439/352 |
| 5,366,385 | 11/1994 | Treleaven | 439/377 |
| 5,484,302 | 1/1996 | Yamada et al. | 439/326 |
| 5,573,408 | 11/1996 | Laub et al. | 439/62 |
| 5,649,831 | 7/1997 | Townsend | 439/157 |
| 5,726,865 | 3/1998 | Webb et al. | 439/327 |
| 5,829,601 | 11/1998 | Yurchenco et al. | 211/41.17 |
| 5,842,880 | 12/1998 | Pei | 439/327 |
| 5,889,656 | 3/1999 | Yin | 439/64 |
| 5,980,299 | 11/1999 | Davis | 439/377 |

FOREIGN PATENT DOCUMENTS

| | | |
|---|---|---|
| 04 741 81 A1 | 11/1992 | European Pat. Off. . |
| 2842332 | 10/1978 | Germany . |

*Primary Examiner*—Khiem Nguyen
*Assistant Examiner*—V. Johnson

[57] ABSTRACT

Retention system (10) for guiding a processor module during mating, and retention thereafter, having a pair of retention members (12) with upper sections (20) pivotable from upright positions to recumbent positions with respect to lower sections (22) when a processor module is absent. Retention members (12) latch a module (16,100) therebetween upon full insertion into guide channels (52). Module (16) includes latching surfaces (78) that latch beneath latch surfaces (76) defined on a latch (70) that is deflectable outwardly to delatch. Module (100) includes latch projections (102) that seat in apertures (88) adjacent the guide channel entrance.

13 Claims, 10 Drawing Sheets

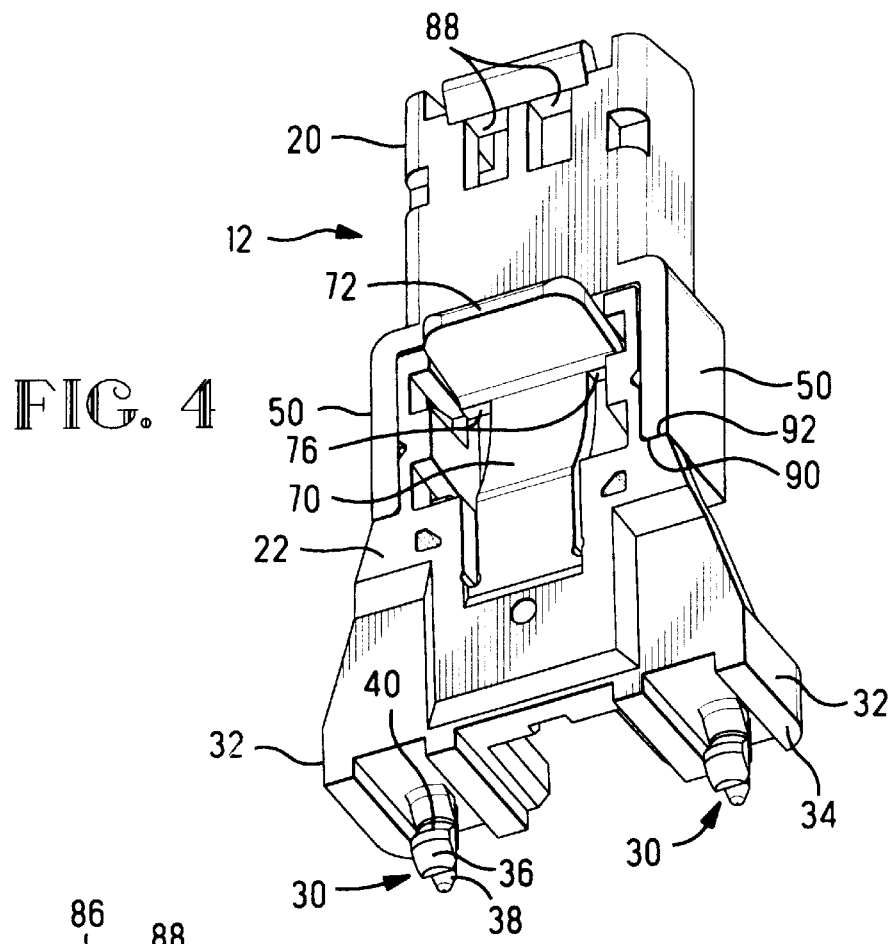
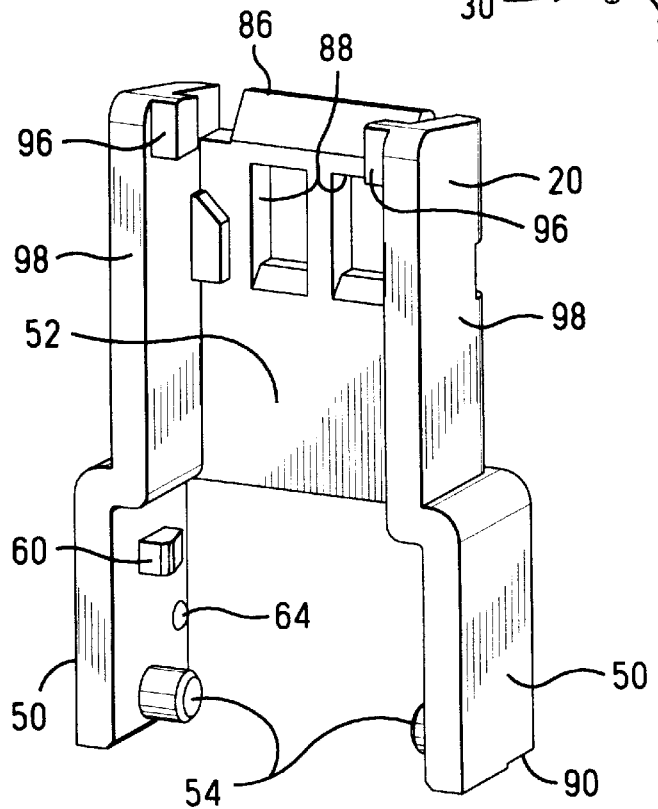

RETENTION MEMBER FOR PROCESSOR MODULE

This application claims benefit of Provisional Appl. No. 60/084,085 filed May 4, 1998.

FIELD OF THE INVENTION

This relates to the field of electrical connectors and more particularly to components mountable to a circuit board.

BACKGROUND OF THE INVENTION

In computers and other electronic equipment, circuit boards are utilized to which are mounted numerous electrical and electronic components. Smaller circuit cards are utilized to establish electrical connections to a larger circuit board in a manner that permits removal and disconnection, by inserting an edge of the card into a receptacle connector mounted on the board and containing an array of contacts connected to circuits of the board; contact sections of the contacts are exposed within a card-receiving cavity of the connector that engage circuit pads on the card surfaces upon card insertion. It has become useful to secure certain cards within larger modules so that components mounted on the card are protected by the module covers during handling. Such modules need to be accurately guided during mating with the receptacle connector so that the leading end of the enclosed card is accurately received into the card-receiving cavity of the connector, since the module covers inhibit accurate visual alignment of the card with the cavity. It is known to provide elongate guide members projecting from the board from ends of receptacle connectors to facilitate mating in similar situations. Such elongate guide members may be mounted on the circuit board substantially prior to their actual use during module mating.

It is desired to provide a system for guiding the module during mating with the receptacle connector. It is also desired to provide module guides that maintain a low profile prior to module mating.

In U.S. patent application Ser. No. 09/063,127 filed Apr. 20, 1998 and assigned to the assignee hereof, is disclosed an assembly that includes a frame mountable on the circuit board surrounding the receptacle connector or optionally as an integral portion of the connector housing. At opposed ends of the frame are mounted respective guide members containing inwardly facing channels precisely aligned with the card-receiving cavity of the connector. The guide members are pivotably secured to the frame, so that the members may be pivoted to a recumbent orientation parallel to the circuit board when a module is not mated to the connector, and be pivoted to an erect position for use.

It is desired to provide retention guides that provide for latching of different types of processor modules.

It is also desired to provide latches on retention guides that are manually actuatable for delatching.

SUMMARY OF THE INVENTION

Guide or retention members of the assembly are mountable onto a circuit board at ends of a receptacle connector, or are integral end sections of a frame surrounding the periphery of the connector, for receipt of end portions of processor modules into guide channels thereof. Each retention member includes intermediate therealong a latch member deflectable outwardly with respect thereto, that is actuatable to become latched to one type of processor module inserted between a pair of the retention members and fully mated with the receptacle connector, with the module having corresponding latches along surfaces of lateral ends thereof intermediate the leading and trailing ends. The latch member includes manually engageable actuation sections and is deflectable to become delatched.

An upper section is pivotably mountable at the top of the retention member and elongates the guide channel for the module, and includes latching apertures adjacent the top for latching of another type of module having a corresponding latch projection adjacent its trailing end, whereby the retention member assembly accommodates either type of module.

In another embodiment, the retention member includes upper and lower sections with the upper section defining a deflectable latch to latch to a module having the intermediate level corresponding latch.

Embodiments of the present invention will now be described by way of example with reference to the accompanying drawings.

BRIEF DESCRIPTION OF THE DRAWINGS

FIGS. 3 and 4 are enlarged isometric views of a retention member;

FIGS. 5 to 7 are isometric views of the upper and lower sections of the retention member of FIGS. 3 and 4;

DETAILED DESCRIPTION

Figure 1:
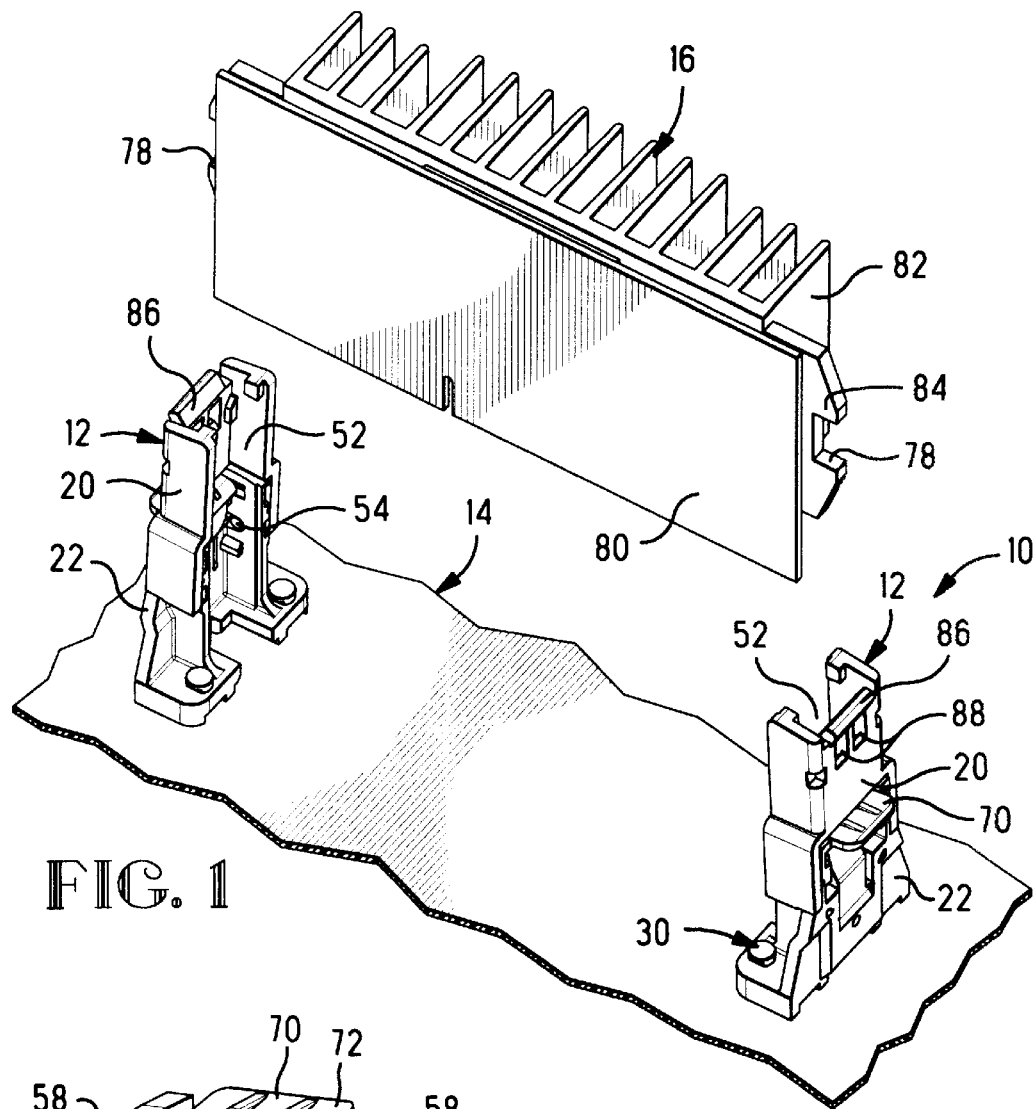
FIG. 1 is an isometric view of an assembly including a pair of retention members mounted to a circuit board, with a processor module poised to be inserted therebetween and latched.
Figure 6:
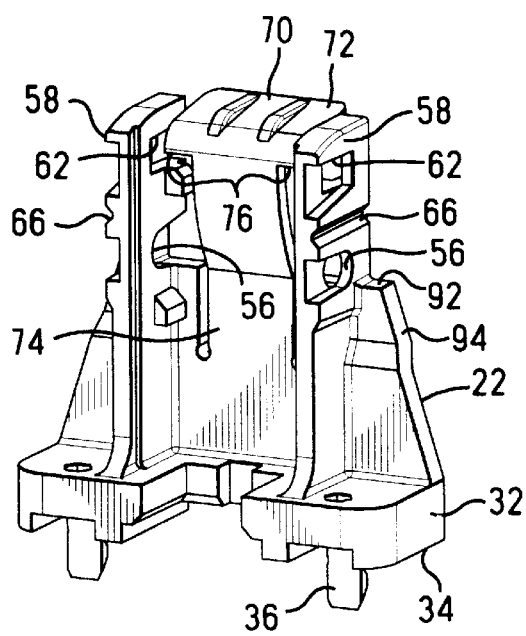

Retention system 10 as shown in FIGS. 1 to 4 comprises a pair of retention member assemblies 12 mounted onto a circuit board 14 and spaced apart to receive therebetween a processor module 16 that will mate with a receptacle connector (not shown) mountable to the circuit board between the retention member assemblies 12. Each retention member assembly 12 includes an upper pivotable section 20 pivotably secured to a lower mounted section 22, and in FIG. 2 the assemblies 12 are seen in their recumbent positions when a processor module is not secured therebetween, facilitating handling and shipping of the circuit board.

Figure 3:
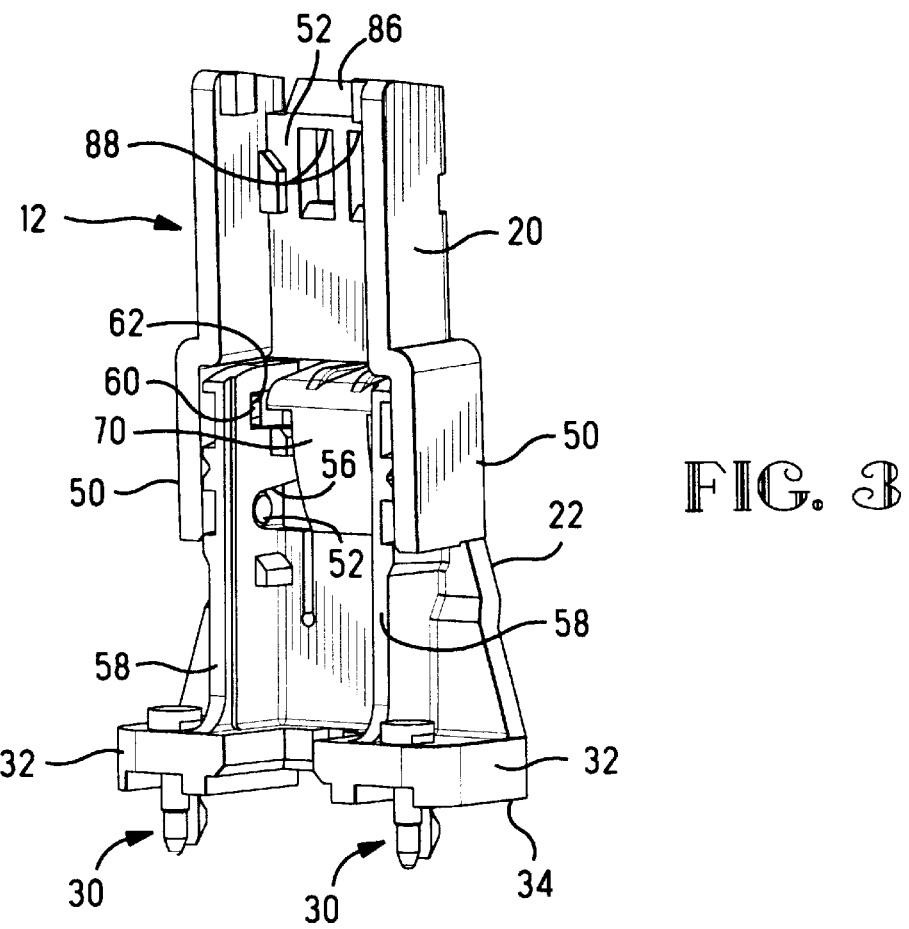
Figure 7:
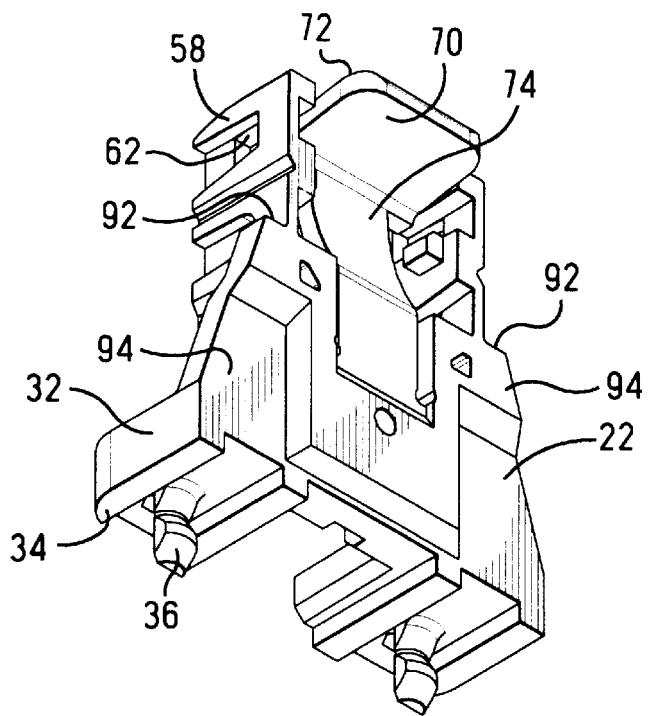

In FIGS. 3 and 4 is seen a retention member assembly 12, with upper section 20 upright with respect to lower section 22, and illustrating the inner and outer sides thereof. A fastening system 30 is defined on each of the mounting flanges 32 to secure the retention member to circuit board 14 along board-mounting face 34, and includes an integral leg 36 and a locking peg 38. When the retention member 12 has been place onto the board with leg 36 extending through a mounting hole of the board, locking peg 38 is urged downwardly through the mounting hole beside leg 36 to deflect the leg laterally such that the locking section 40 of the leg becomes locked underneath the board.

Figure 2:
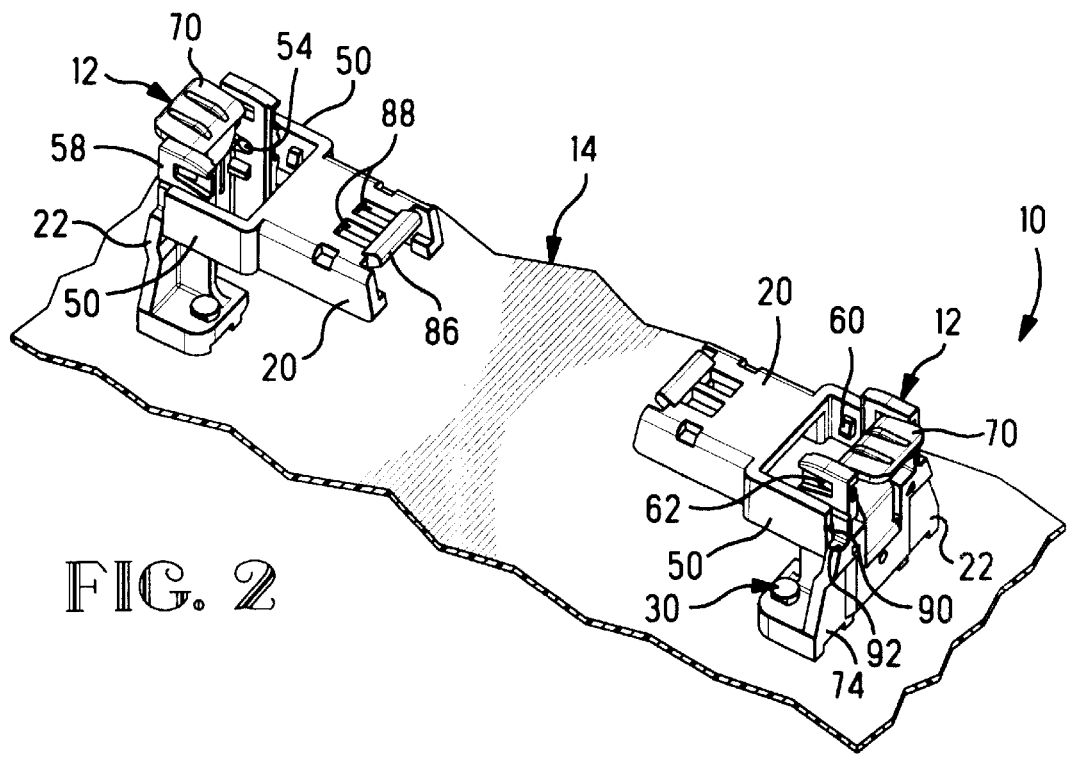
FIG. 2 is an isometric view of the frame of FIG. 1 with the retention members pivoted to recumbent positions when not in use.
Figure 8:
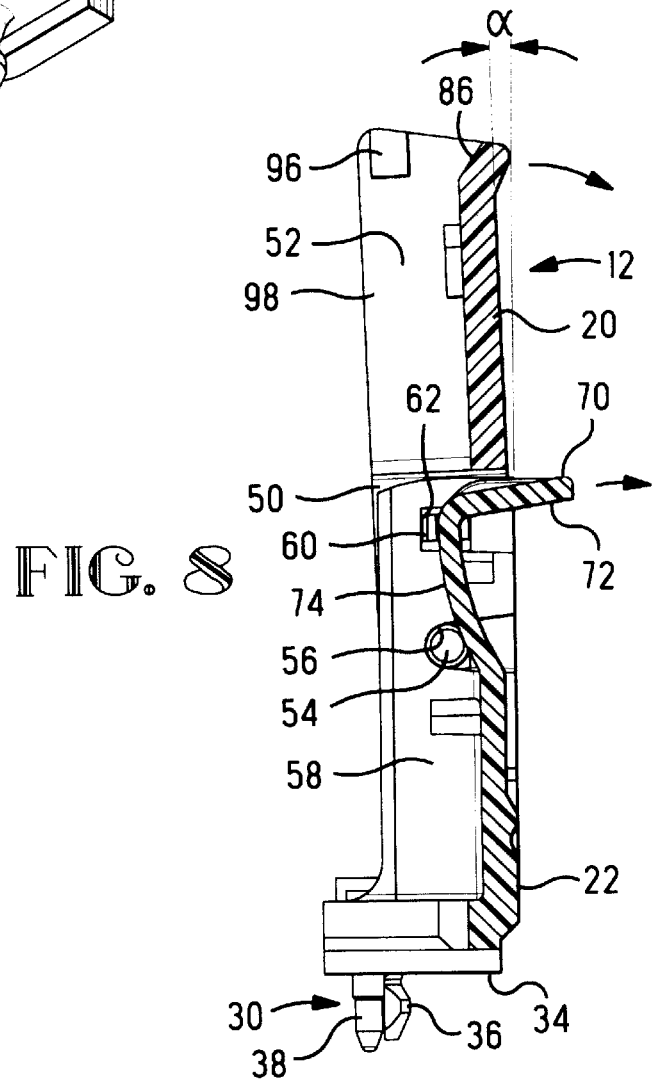
FIG. 8 is a cross-sectional view of the retention member of FIGS. 3 and 4 in its upright position.

Upper section 20 is shown to include a pair of tab sections 50 depending therefrom parallel to and offset outwardly from, sides of guide channel 52 that extends vertically therealong from the top of upper section 20. Extending inwardly toward each other are cylindrical pivot bosses 54 that define first pivoting sections. Lower section is shown to include apertures 56 through side walls 58 thereof that define second pivoting sections cooperable with pivot bosses 54. Upper section 20 is assembled to lower section 22 for tab sections 50 to temporarily be deflected outwardly to pass alongside outer surfaces of side walls 58 until embossments 54 seat in apertures 56. Upper section 20 also includes projections or detents 60 that seat in recesses 62 of lower section 22 to hold upper section 20 upright with respect to lower section 22, as best seen in FIGS. 3 and 8. Detents 60 include chamfered front and rear faces to facilitate pivoting of upper section 20 with respect to lower section 22. Preferably, upper section 20 is set at an angle α inwardly from vertical, as shown in FIG. 8, for reasons to be discussed with respect to FIGS. 10 and 11, and angle α may be for example about 2 degrees. A domed shaped detent 64 is defined along tab sections 50 that cooperates with groove 66 along the outer surface of a respective side wall 58 of lower section 22, to maintain the upper section in its fully recumbent position (FIG. 2).

Figure 9:
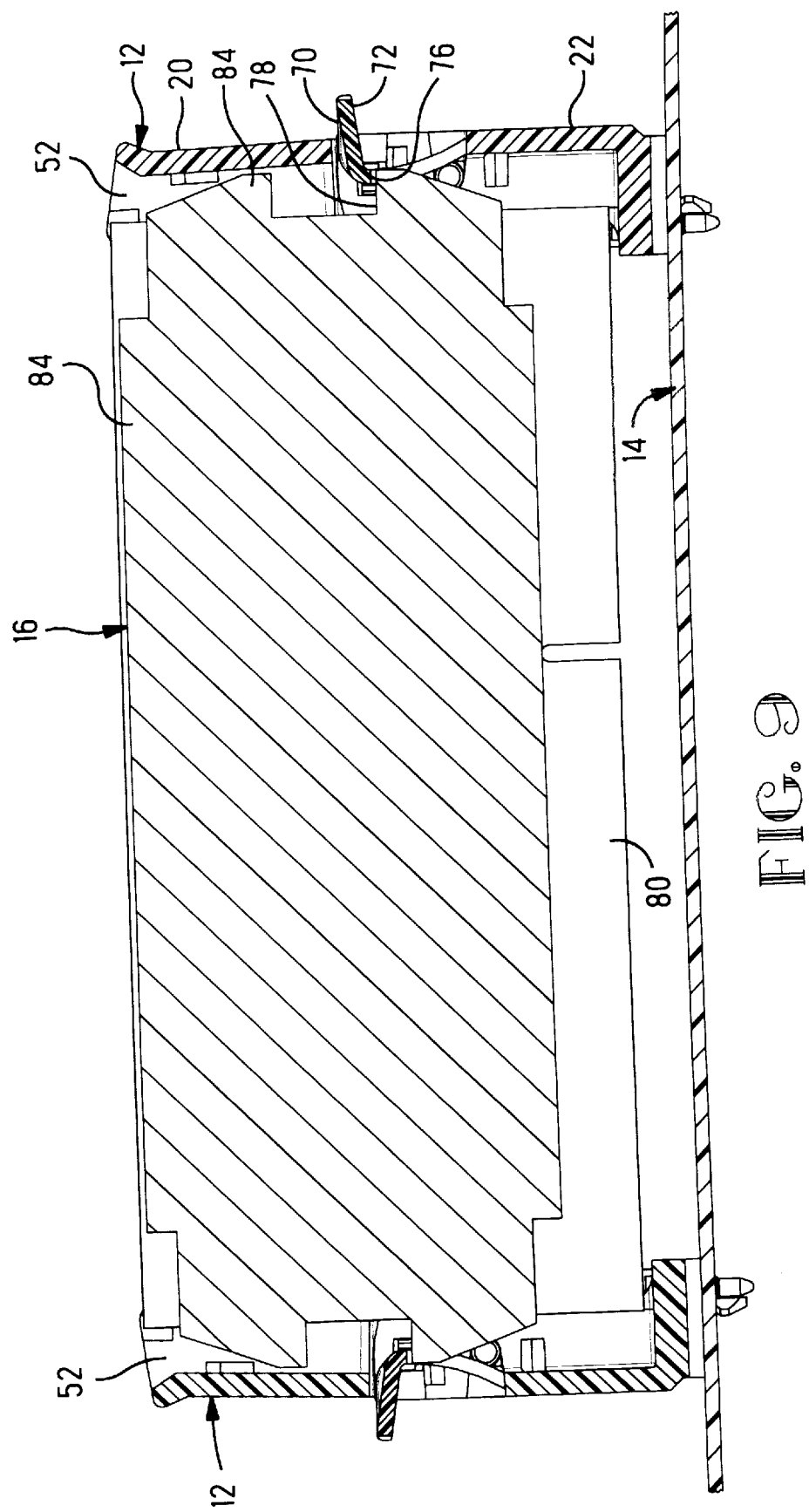
FIG. 9 is a cross-sectional view of the module of FIG. 1 latched in position between the pair of retention members.

In a first latching system, a deflectable latch 70 is defined by lower section 22, having a manually engageable tab 72 at a free end of a deflectable spring arm 74. Tab 72 extends horizontally from the end of spring arm 74, and defines downwardly facing latching surfaces 76 adjacent spring arm 74 that latch above cooperating latching surfaces 78 of processor module 16, as illustrated in FIG. 9. The free end of spring arm 74 of latch 70 protrudes into guide channel 52 when undeflected. Spring arm 74 is manually deflectable outwardly to delatch from the module. Processor module 16 is shown in FIGS. 1 and 9 to be of the type having a processor card 80 and a massive heat sink 82, and the latching surfaces 78 are defined in a recess of a lateral flange 84 extending from each end of the heat sink, intermediate the leading and trailing ends of the module. Because the latch is defined on the lower section 22, the lower section is usable by itself for securing module 16, if desired.

Figure 10:
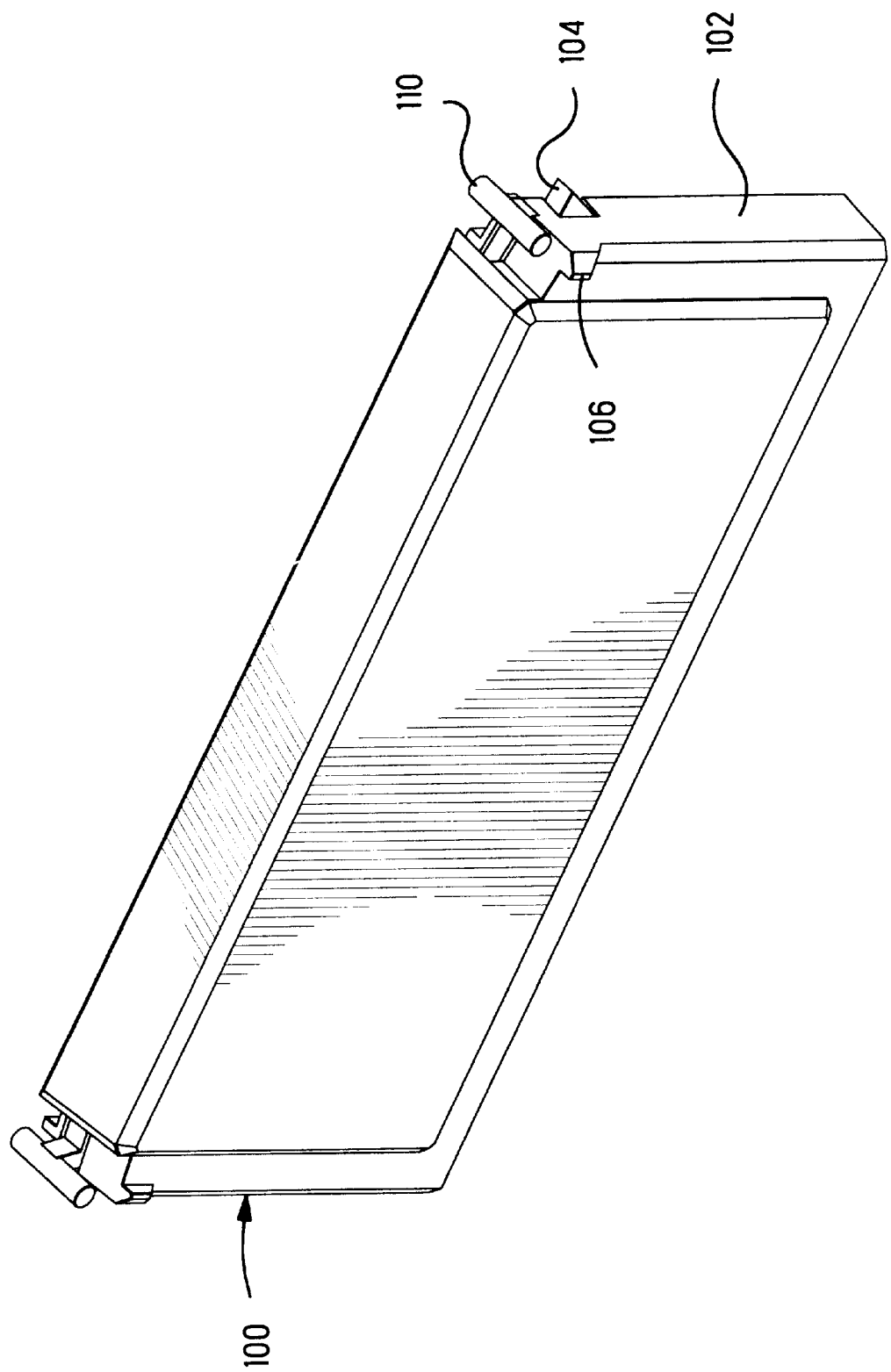
FIG. 10 is an isometric view of another type of processor module.
Figure 11:
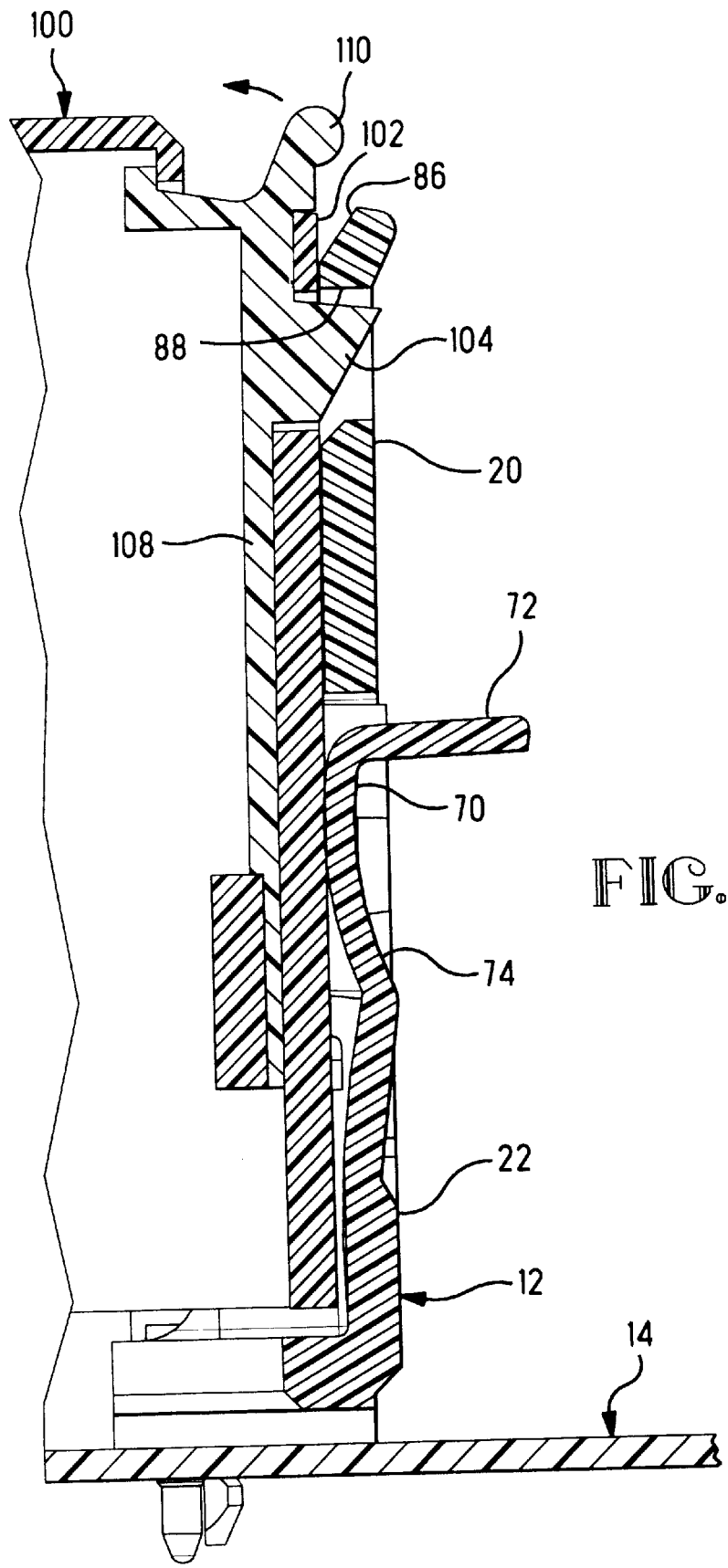
FIG. 11 is a cross-sectional view of the module of FIG. 10 latched in position between the pair of retention members.
Figure 12:
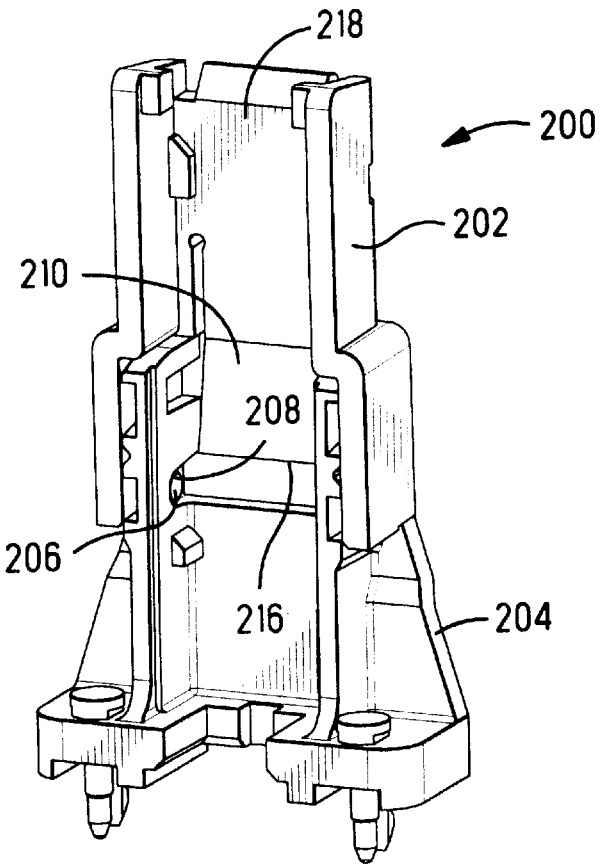
FIGS. 12 and 13 are isometric views of a second embodiment of retention member.
Figure 13:
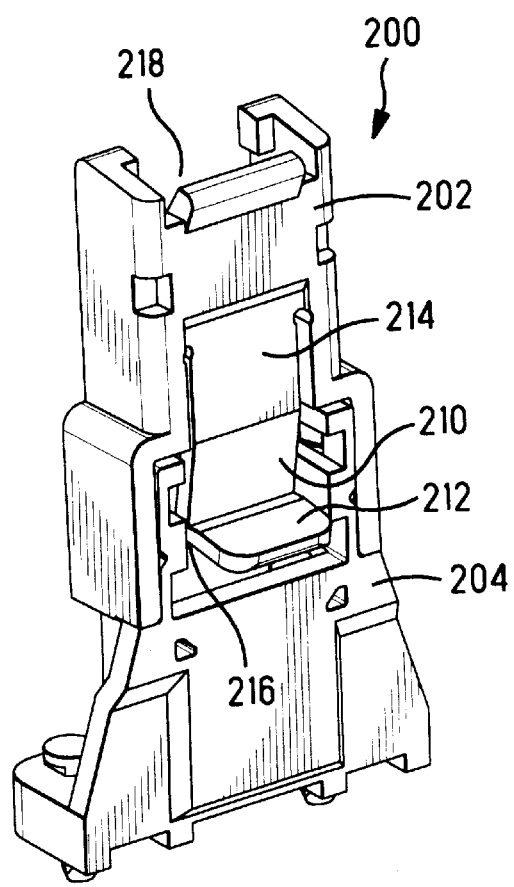
Figure 14:
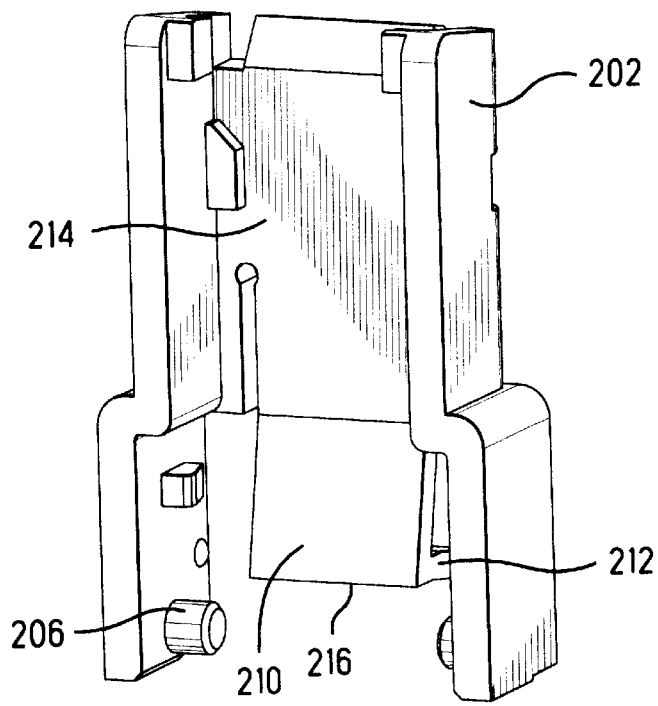
FIGS. 14 and 15 are isometric views of the upper and lower sections of the retention member of FIGS. 12 and 13.
Figure 15:
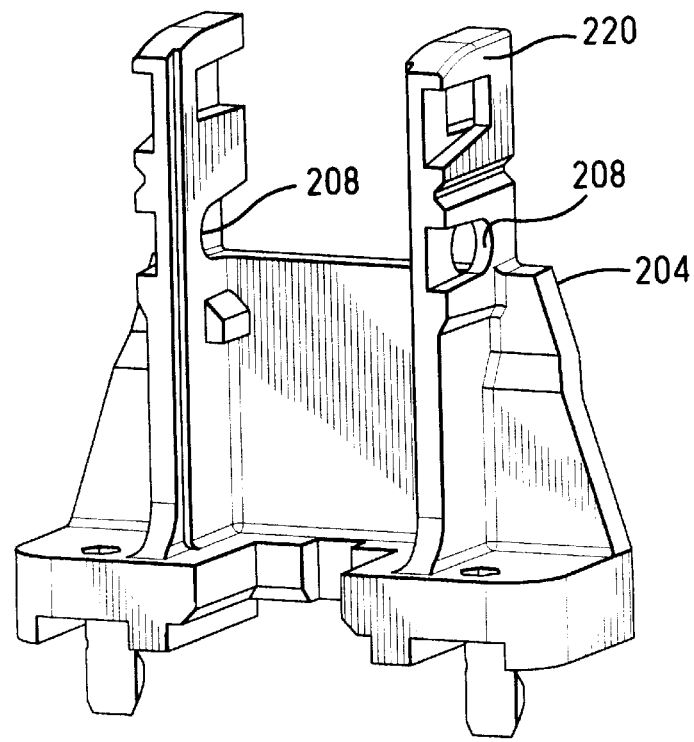
Figure 16:
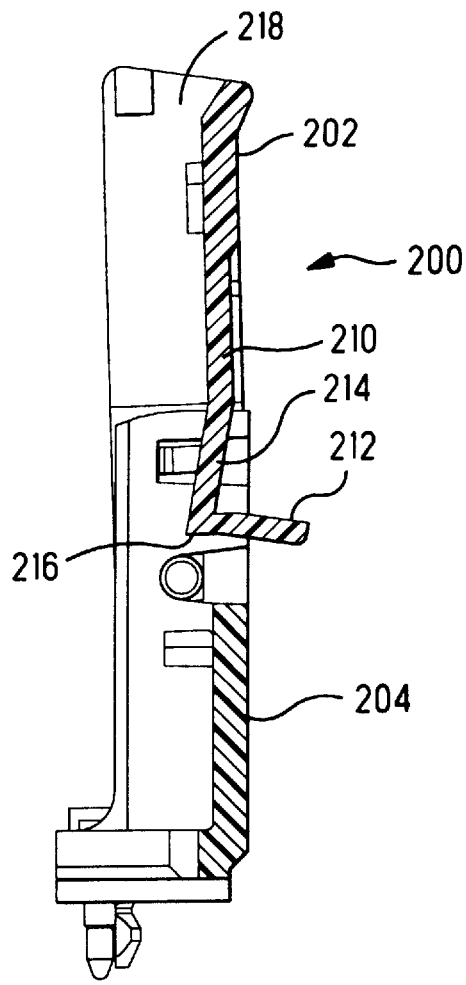
FIGS. 16 and 17 are cross-section views of the retention member of FIGS. 12 and 13, in the upright and recumbent positions, respectively.

Entrance 86 to guide channel 52 includes a chamfered surface to facilitate entry of a processor module. A pair of apertures 88 are located adjacent entrance 86 along the channel bottom. Referring now to FIGS. 10 and 11, a second type of processor module 100 provides a cover enclosing a processor card therewithin, and end walls 102 of the cover include latch projections 104 projecting outwardly therefrom adjacent the trailing end of the module, with the latch projection being off-center with respect to the end wall 102. The retention members 12 of the present invention provide a second latching sytem for latching of such modules 100, in that one of the pair of apertures 88 of each retention member will latch with the off-center latch projections 104 irrespective of the orientation of an upright module. Thus the retention system of the present invention accommodates the two types of modules.

Further, upper section 20 is incrementally deflectable outwardly upon insertion of module 100 while maintaining bias against end wall 102, in order to assure the maintenance of the latched state. Bottom surface 90 of tab section 50 is an abutment surface that abuts top surface 92 of gusset 94 of lower section 22 upon assembly, assuring the maintenance of the slight angle of upper section 20, in cooperation with embossments 54 in apertures 56; when upper section is deflected outwardly by a processor module 100, surfaces 90,92 are compressed generating a bias urging the upper section inwardly against the module end wall. Additionally to assure maintenance of the latched condition, a pair of lugs 96 are defined adjacent entrance 86 along side walls 98 of guide channel 52. Lugs 96 will become placed behind protrusions 106 to secure the module to upper section 20. Module 100 is of the type having latch projection 104 disposed on a movable arm 108 retained in a channel inside of end wall 102 of the module cover, as is shown in phantom in FIG. 11; latch projection 104 extends through a window of end wall 102 and deflects inwardly during module insertion until latch projection seats into an aperture 88 of upper section 20. A manually engageable actuator 110 is defined at the free end of arm 108 to permit delatching of module 100 from the retention members.

Figure 17:
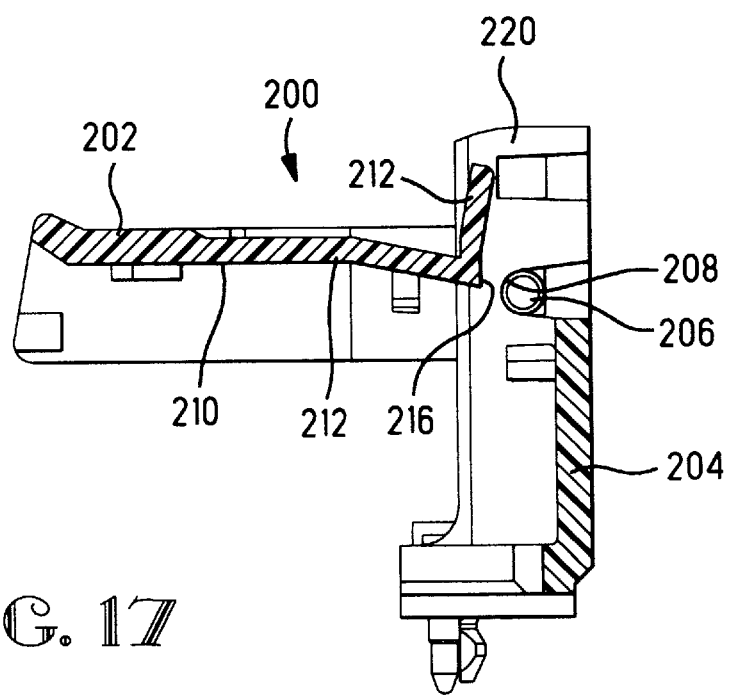

Another embodiment of retention member 200 is shown in FIGS. 12 to 17. Upper section 202 is pivotably mounted to lower section 204 at pivot sections 206,208 similarly to the retention member 12 of FIGS. 3 to 7. A latch section 210 is defined on upper section 202 and deflectable outwardly. A manually engageable tab 212 projects outwardly from a free end of a deflectable spring arm 214, and defines a downwardly facing latching surface 216 at its innermost extent. In its undeflected state, the latch arm partially protrudes inwardly into guide channel 218 (best seen in FIG. 16) in order for latching surface 216 to engage a corresponding latching surface of a module, such as upwardly facing latching surface 78 of module 16 in FIGS. 1 and 9. As seen in FIG. 17, when upper section 202 has been pivoted to its recumbent position, tab 212 is recessed beneath the upper ends of side walls 220 of lower section 204 thereby being physically protected. Retention member 200 may also include apertures adjacent its upper end to latch to a module such as module 100 of FIGS. 10 and 11, and upper section 202 may similarly be angled slightly inwardly like upper section 20 of FIG. 8.

Variations and modifications may be devised that are within the spirit of the invention and the scope of the claims. For example, latch 70 may include a central aperture adjacent the free end of latch arm 72 to accommodate a centered latch projection of a processor module.

What is claimed is:

1. A retention system for a processor module, for retaining a processor module in a mated position with respect to a connector, comprising:

opposed members positioned at ends of the connector defining guide channels extending to ends of the connector, the opposed members each having an upper section and a lower section;

said opposed members each having a first latching section intermediate vertically therealong for latching to a first type of processor module and releasably retaining same in a mated position with the connector, and further having a second latching section adjacent an upper end for latching to a second type of processor module and releasably retaining same in a mated position with the connector, whereby the opposed members are utile with either style of processor module.

2. The module retention system as set forth in claim 1 wherein said upper and lower sections together defining opposed module-guiding channels extending to ends of the connector when in a module-receiving position.

3. The module retention system as set forth in claim 1 wherein said opposed members are physically separate from each other.

4. The module retention system as set forth in claim 1 wherein said upper section is removably attachable to said lower section.

5. The module retention system as set forth in claim 1 wherein said upper sections are pivotable with respect to said lower sections toward each other, to be pivoted to a recumbent position when a processor module is absent.

6. The module retention system as set forth in claim 5 wherein each said upper section is latchable to a said lower section when pivoted to an upright position.

7. The module retention system as set forth in claim 6 wherein each said upper section includes a pair of opposed tab sections depending therefrom containing inwardly extending pivot bosses that are seated in pivot apertures proximate upper ends of a said lower section, a pair of inwardly extending detents spaced upwardly from said pivot bosses that are latchable in associated latch apertures adjacent said upper ends of said lower section, and a pair of inwardly extending dome-shaped detents that seat in outwardly facing grooves proximate said upper ends of said lower section for precisely positioning said upper section in said upright position assuring maintenance of a latched condition with a respective said module, and lower ends of said tab sections abut upwardly facing stop surfaces of said lower section to define an assured stop when said upper section has been pivoted to an outermost position during delatching.

8. The module retention system as set forth in claim 1 wherein said first latching system of each said opposed member is a latch surface defined on a deflectable arm of said lower section having a manually engageable tab for enabling manual pivoting thereof to delatch from a said processor module.

9. The module retention system as set forth in claim 8 wherein said latch surface is a downwardly facing ledge along at least one side of said deflectable arm.

10. The module retention system as set forth in claim 1 wherein said second latching system of each said opposed member includes a projection-receiving aperture at an upper end of said upper section, and said upper section is incrementally movable outwardly against spring bias for enabling manual pivoting thereof to delatch from a said processor module.

11. The module retention system as set forth in claim 10 wherein each said upper section includes a pair of opposed lugs on side walls of said module-receiving channel that seat behind corresponding protrusions of a respective said module to prevent inadvertent outward pivoting of said upper section.

12. The module retention system as set forth in claim 1 wherein said first latching system of said opposed members is defined at a lower end of said upper section and comprises a deflectable arm that includes a downwardly facing latching surface cooperable with an upwardly facing latching surface of a said processor module.

13. The module retention system as set forth in claim 12 wherein said deflectable arm is positioned between opposed side walls of said lower section when said upper section is in an upright position, and said deflectable arm includes an outwardly extending manually engageable tab projecting from a lower end thereof, and said manually engageable tab is recessed below upper ends of said opposed side walls of said lower section when said upper section is in a recumbent position.

* * * * *